(12) United States Patent
Salcedo-Suner

(10) Patent No.: US 6,636,067 B1
(45) Date of Patent: Oct. 21, 2003

(54) METHOD OF TESTING FOR MICRO LATCH-UP

(75) Inventor: Jorge Salcedo-Suner, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/206,071

(22) Filed: Jul. 26, 2002

(51) Int. Cl.[7] .............................................. G01R 31/26
(52) U.S. Cl. ...................................................... 324/765
(58) Field of Search ................................. 324/763, 765, 324/768, 755, 750, 158.1; 327/355, 361, 18, 20, 23; 257/138, 139, 142; 348/126; 714/731; 361/801, 91, 101, 111

(56) References Cited

U.S. PATENT DOCUMENTS 5,326,994 A * 7/1994 Giebel et al. ................ 257/174
5,541,547 A * 7/1996 Lam ............................ 327/355

* cited by examiner

Primary Examiner—Ernest Karlsen
Assistant Examiner—Trung Nguyen
(74) Attorney, Agent, or Firm—J. Dennis Moore; W. James Brady, III; Frederick J. Telecky, Jr.

(57) ABSTRACT

A reliable method of testing a CMOS-based integrated circuit device having a low-impedance path between I/O pin(s) and GND for potential micro-latch-up. The test method detects a low impedance path between the integrated circuit device I/O pin(s) and GND(s) caused by a parasitic SCR that is not detectable using conventional latch-up detection test methods.

7 Claims, 2 Drawing Sheets

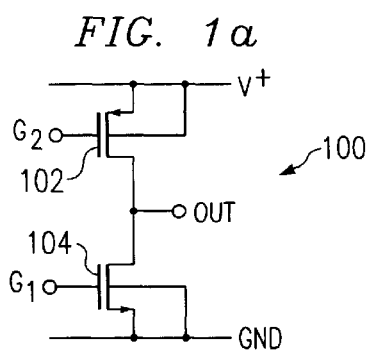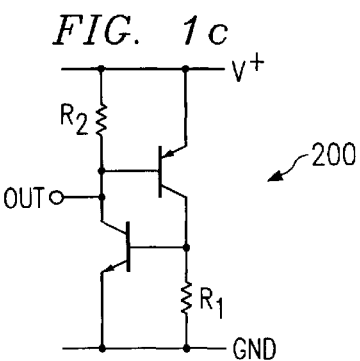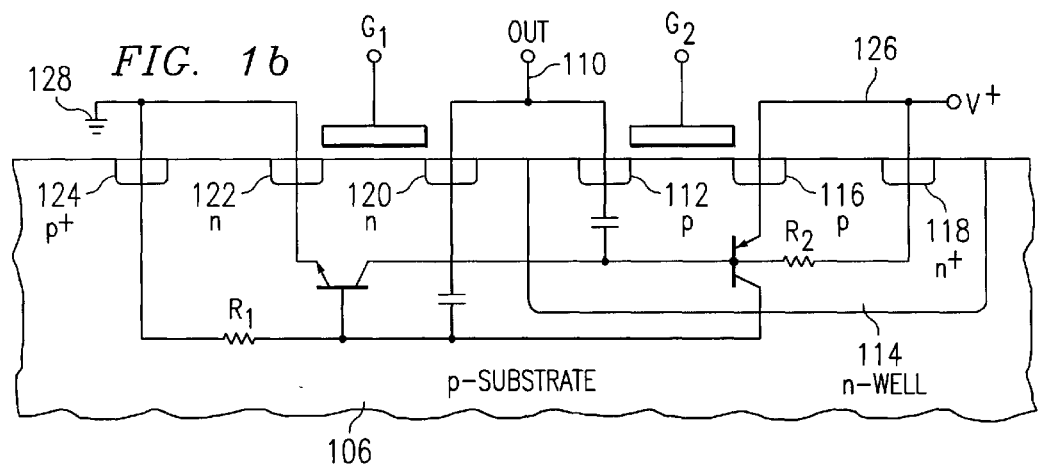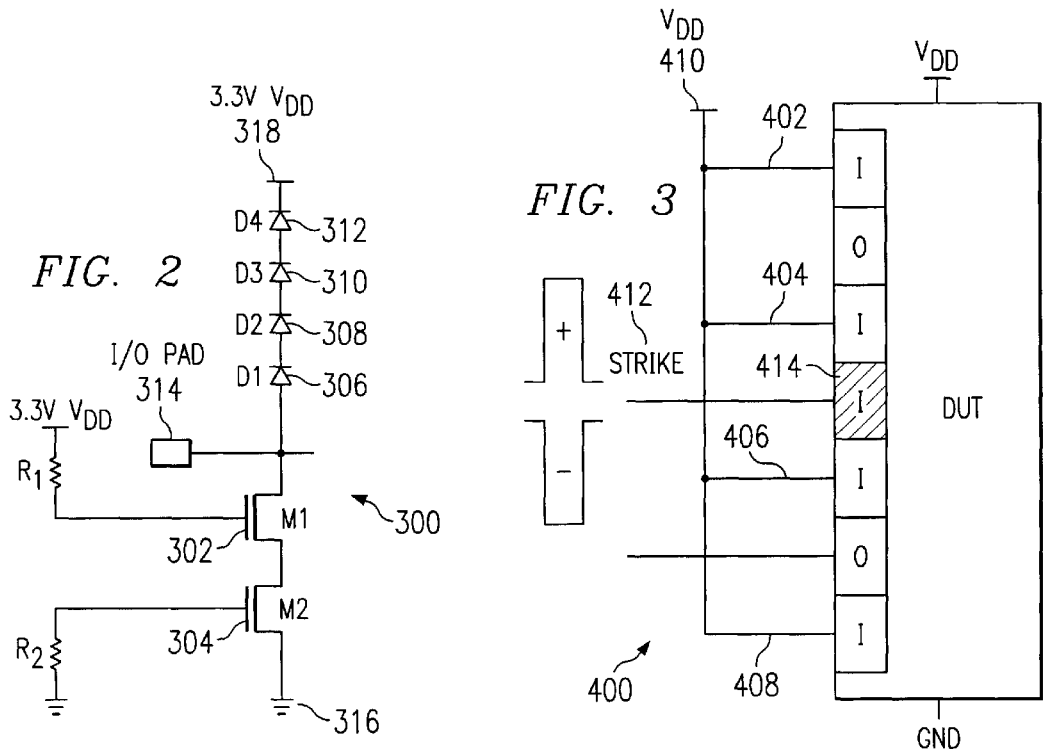

METHOD OF TESTING FOR MICRO LATCH-UP

BACKGROUND OF THE INVENTION

1. Field of the Invention

This invention relates generally to methods of testing integrated circuit (IC) devices, and more particularly, to a method of testing IC devices to determine whether a low impedance path exists between input/output (I/O) pins and IC ground.

2. Description of the Prior Art

It is well known that a four-layer sandwich of doped material NPNP, forms a silicon-controlled rectifier (SCR). Once an SCR is "fired" (switched to its 'ON' conducting state), it continues to conduct until its gate signal is removed. The SCR is sometimes undesirable for certain applications, since inadvertent firing of an SCR will usually result in excessive current flow. This excessive current flow can result in destructive failure of an integrated circuit that employs an SCR.

CMOS devices always have parasitic SCR structures. The firing of an SCR is termed latch-up in CMOS circuits. A CMOS designer must therefore be certain that latch-up cannot occur in any CMOS design, i.e., a malfunction of a CMOS integrated circuit caused by firing a parasitic PNPN structure. Latch-up, as used herein, means a state in which a low impedance path results from an overstress that triggers a parasitic SCR structure, and that persists after removal or cessation of the trigger condition.

Testing for latch-up during device testing is important to isolating devices with latch-up problems. Conventional latch-up test techniques cannot however, detect a potential low impedance path between I/O(s) and GND(s) where the low impedance path is caused by a parasitic SCR (micro-latch-up), since the anode of the SCR is placed in the I/O path.

In view of the foregoing, it would be desirable and advantageous in the art to provide a reliable method of testing an integrated circuit device having a low-impedance path between I/O pin(s) and GND for potential micro-latch-up.

SUMMARY OF THE INVENTION

The present invention is directed to a reliable method of testing an integrated circuit device having a low-impedance path between I/O pin(s) and GND for potential micro-latch-up.

In one aspect of the invention, a test method is provided to detect a low impedance path between integrated circuit device I/O pin(s) and GND(s), to increase device reliability during test and/or qualification processing.

In another aspect of the invention, a test method is provided to detect a low impedance path between integrated circuit device I/O pin(s) and GND(s) caused by a parasitic SCR.

In still another aspect of the invention, a test method is provided to detect a low impedance path between integrated circuit device I/O pin(s) and GNS(s) that are not detectable using conventional latch-up detection test methods.

BRIEF DESCRIPTION OF THE DRAWINGS

Other aspects, features and advantages of the present invention will be readily appreciated as the invention becomes better understood by reference to the following detailed description when considered in connection with the accompanying drawing figures wherein:

FIG. 1(a) is a simple schematic diagram illustrating two CMOS transistors that produce a parasitic SCR in the associated substrates;

FIG. 1(b) illustrates a cross section of the circuit layout shown in FIG. 1(a) showing how the parasitic SCR is formed in the substrate;

FIG. 1(c) is a simple schematic diagram illustrating the equivalent SCR circuit that is implicit in substrate associated with FIG. 1(a);

FIG. 2 is a simple schematic diagram illustrating two CMOS transistors and a plurality of diodes connected from any input/output (I/O) pin creating an SCR path between the pin and GND or Vdd;

FIG. 3 is a diagram illustrating a test technique to determine the existence of micro-latch-up by connecting the device inputs to the highest permitted voltage and then applying a strike (current injection) pulse in the adjacent pin, to induce the associated SCR to fail;

Figure 4:
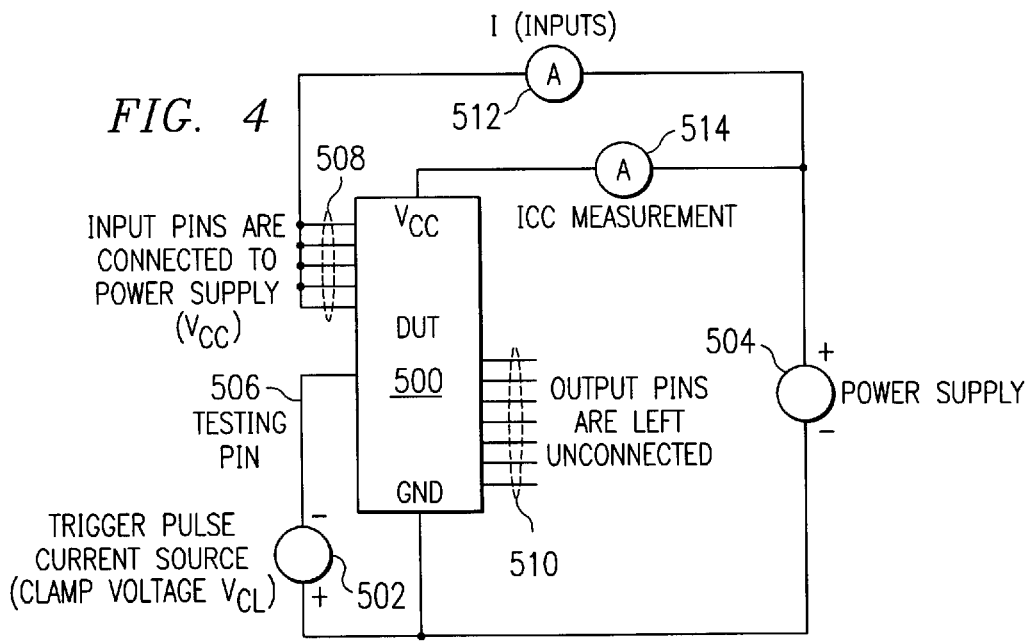
FIG. 4 illustrates a test set-up using a negative strike to determine the existence of a micro-latch-up condition for a device under test.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

As stated herein before, CMOS devices always have parasitic SCR structures. The firing of an SCR is termed latch-up in CMOS circuits. A CMOS designer must therefore be certain that latch-up cannot occur in any CMOS design, i.e., a malfunction of a CMOS integrated circuit caused by firing a parasitic PNPN structure. Latch-up, as used herein, means a state in which a low impedance path results from an overstress that triggers a parasitic SCR structure, and that persists after removal or cessation of the trigger condition. More specifically, micro-latch-up is a malfunction state in which a low-impedance path between I/O pin(s) and GND is created (sinking or pulling current from the I/O pin(s)), as a result of a current and/or voltage overstress (triggering condition) in neighboring pin(s), and that persists subsequent to removal or cessation of the triggering condition.

Testing for latch-up during device testing is important to isolating devices with latch-up problems. Conventional latch-up test techniques cannot however, detect a potential low impedance path between I/O(s) and GND(s) where the low impedance path is caused by a parasitic SCR (micro-latch-up), since the anode of the SCR is placed in the I/O path.

FIG. 1(a) is a simple schematic diagram of a device 100 illustrating two CMOS transistors 102, 104 that produce a parasitic SCR in their associated substrates.

FIG. 1(b) illustrates a cross section of the device 100 shown in FIG. 1(a) showing how the parasitic SCR is formed in the substrate 106. The parasitic SCR can conduct current equally well in both directions. The injection of a positive current triggers the device 100 on when the anode voltage is positive. A negative trigger current flows in the gate 108 when the anode voltage reverses. The parasitic SCR between output 110 and V+ 126 can be seen to be formed via p implant/deposition 112, n-well 114, p implant/deposition 116, and n+ implant/deposition 118 (PNPN). The parasitic SCR between output 110 and GND 128 can be seen to be formed via n implant/deposition 120, p-substrate 106, n implant/deposition 122, and p+ implant/deposition 124 (NPNP).

FIG. 1(c) is a simple schematic diagram illustrating the equivalent SCR circuit 200 that is implicit in substrate 106 associated with the device 100 shown in FIG. 1(a).

FIG. 2 is a simple schematic diagram illustrating another device 300 having two CMOS transistors 302, 304 and a plurality of diodes 306, 308, 310, 312 connected from an input/output (I/O) pin/pad 314 creating an SCR path between the I/O pin/pad 314 and GND 316 or Vdd 318. Device 300 has a parasitic SCR that has its anode tied to the I/O pad 314 and not directly to Vdd 318. Current can flow from the I/O pad 314 to GND 316 through the parasitic SCR if the voltage at the I/O pad 314 is higher than the holding voltage of the parasitic SCR. Monitoring the supply current Idd subsequent to a stress condition may not detect this SCR current flow if the stress condition is characterized by a voltage at the I/O pad 314 that is lower than the holding voltage of the parasitic SCR, since the parasitic SCR will not turn on. A stress condition sufficient to activate the parasitic SCR and induce a micro-latch-up condition may be triggered by an adjacent I/O cell, or noise, among other things. Micro-latch-up caused by a parasitic PNPN structure, for example, associated with an I/O cell "A" as a consequence of stress applied on an adjacent I/O cell "B" may cause I/O cell "A" to sink a high amount of current from its associated I/O connection.

FIG. 3 is a diagram illustrating a test technique to determine the existence of a micro-latch-up condition by connecting the inputs 402, 404, 406, 408 of a device 400 to the highest permitted voltage 410 and then applying a strike (current injection) pulse 412 in the adjacent pin 414, to induce one or more of the associated SCRs to fail. Device 400 can, for example, comprise a plurality of devices 300 such as depicted in FIG. 2.

FIG. 4 illustrates a test set-up using a negative strike generated via a trigger pulse source 502 that may be, for example, a current source, to determine the existence of a micro-latch-up condition as defined herein before, for an integrated circuit device 500 under test. Micro-latch-up, as stated herein before, can occur when the anode of a parasitic SCR is tied to an I/O pin/pad. Since current is provided from the I/O connection, monitoring the I/O current subsequent to a stress condition will detect the occurrence of micro-latch-up. The present inventor has discovered that application of a trigger pulse to an I/O pad associated with a particular integrated circuit cell can trigger parasitic SCR devices associated with adjacent I/O cells through the integrated circuit substrate.

Micro-latch-up is different from conventional latch-up where the SCR anode is instead tied to the supply Vdd that also provides the current flow. The present inventor has also found that although monitoring the current Idd flowing from Vdd following a stress condition can be used to detect a latch-up condition, this technique may not also detect the occurrence of micro-latch-up.

The present inventor found the test set-up shown in FIG. 4 to be operational to determine the existence of micro-latch-up using the following test conditions: The operating temperature is most preferably set to its maximum level determined by the device under test 500. The power supply 504 is most preferably set to its maximum level ($Vcc_{(max)}$). All inputs with the exception of the test pin 506 are most preferably connected to ($Vcc_{(max)}$) 504. Current from the input pins 508 are most preferably sensed continuously. The trigger pulse from the current source 502 is applied on the test pin 506 in a similar fashion as generally applied when testing for the presence of conventional latch-up conditions. Active low outputs 510 are generally left unconnected, and can be stressed by pulling current from the respective output pins. Active high outputs 510 are generally left unconnected, and can be stressed by forcing current in to the respective output pins. Generally, inputs 508 and high impedance outputs can be stressed in both directions.

Using the test conditions described above, a test procedure to determine the presence of a micro-latch-up condition is then implemented as follows: The device under test (CMOS based integrated circuit) 500 is first connected as depicted in FIG. 4. Next, the power supply voltage ($Vcc_{(max)}$) is applied. Next, each I/O input pin 508 is connected to ($Vcc_{(max)}$). Looking again at FIG. 4, a current measurement instrument 512 can also be seen connected to measure supply current Idd from the power supply 504. Immediately following application of ($Vcc_{(max)}$) to the input pins 508, the supply current Idd from the input pins 508 is then measured. Next, a trigger pulse current is applied to a desired test pin 506; and after the trigger pulse has been applied for a desired period of time, the trigger pulse current source 502 is immediately removed. Next, the supply current Idd from the input pins 508 is again measured. The supply current Idd from the input pins 508 before application of the trigger pulse is then compared with the supply current Idd following removal of the trigger pulse current source 502. The present inventor has found the presence of micro-latch-up to be indicated when the difference between these two Idd measurements has increased more than about 3 mA, or the device under test 500 becomes non-functional. The present inventor has found that micro-latch-up current can typically vary from about 3 mA to greater than 500 mA in some CMOS base integrated circuit devices.

Figure 5:
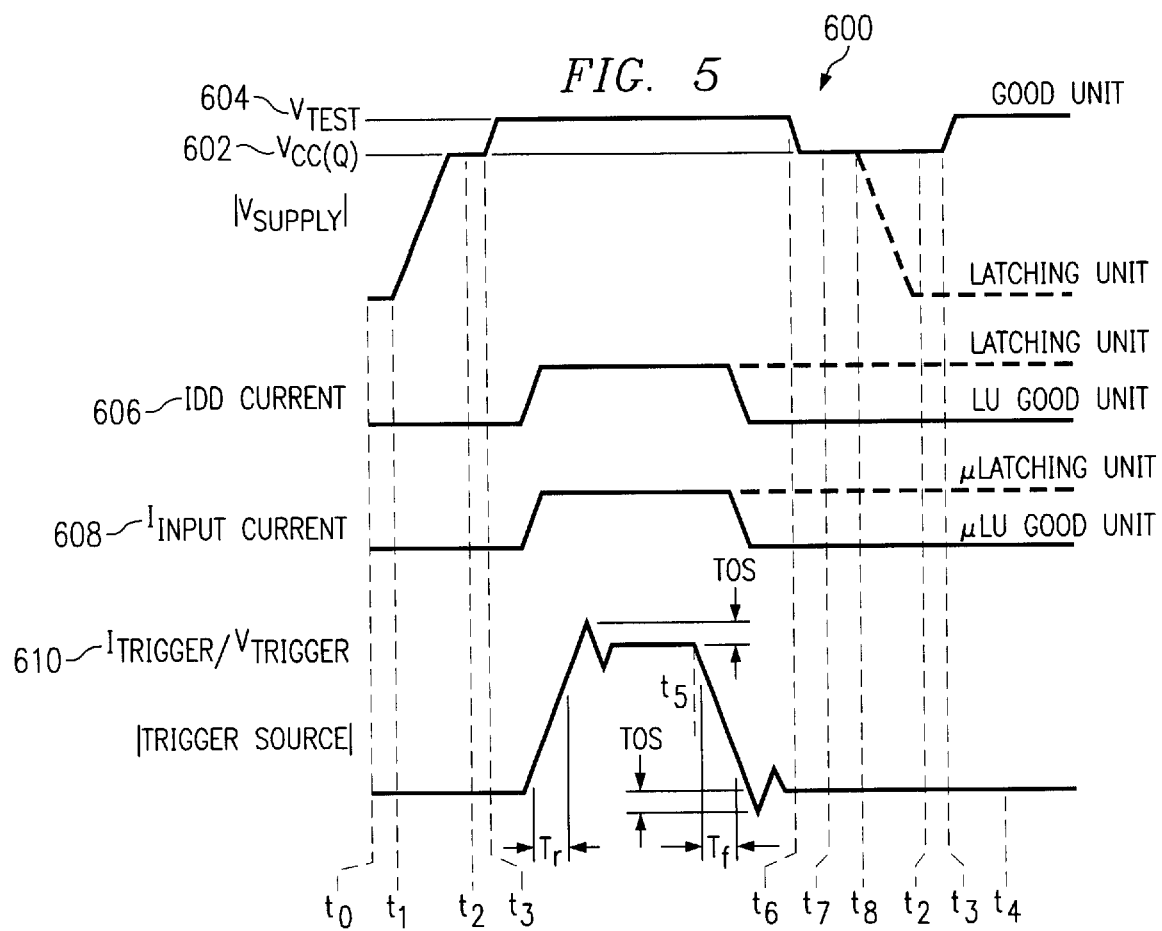
FIG. 5 is a waveform diagram illustrating current and voltage waveforms associated with a device that exhibits micro-latch-up.

FIG. 5 is a waveform diagram 600 illustrating current and voltage waveforms associated with a device 500 that exhibits micro-latch-up. The top waveform depicts a quiescent supply voltage $Vcc_{(Q)}$ 602 and a maximum supply voltage ($Vcc_{(max)}$) 604. Looking again at FIG. 4, an Icc current measurement device 514 can be seen connected to the power supply 504. This measurement device 514 is used to measure the supply current Idd 606 shown in FIG. 5. The bottom waveform shows a trigger pulse 610 that is generated via the trigger pulse current source 502. The waveform immediately above the trigger pulse waveform 610 depicts the input current 608 flowing from the input pins 508. Continuous flow of supply current Idd 606 following termination of the trigger pulse 610 is indicative of a latched device 500. Continuous flow of input current 608 from the input pins 508 is indicative of a micro-latched device 500.

In view of the above, it can be seen the present invention presents a significant advancement in the art of CMOS integrated circuit latch-up test techniques. Further, this invention has been described in considerable detail in order to provide those skilled in the integrated circuit testing arts with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A method of testing a CMOS based integrated circuit device, the method comprising the steps of:

applying a maximum supply voltage to at least one first input pin;

measuring a first supply current from the at least one first input pin;

applying a strike pulse to a second input pin that is adjacent to at least one first input pin;

measuring a second supply current from the at least one first input pin subsequent to conclusion of the strike pulse to the second input pin; and comparing the first supply current with the second supply current to determine whether a micro-latch-up condition is present.

2. The method according to claim 1 wherein the step of comparing the first supply current with the second supply current to determine whether a micro-latch-up condition is present comprises comparing the first supply current with the second supply current to determine whether the second supply current exceeds the first supply current by at least 3 mA.

3. The method according to claim 1 wherein the step of comparing the first supply current with the second supply current to determine whether a micro-latch-up condition is present comprises comparing the first supply current with the second supply current to determine whether the CMOS based integrated circuit is non-functional.

4. The method according to claim 1 wherein the step of comparing the first supply current with the second supply current to determine whether a micro-latch-up condition is present comprises comparing the first supply current with the second supply current to determine whether the second supply current exceeds the first supply current.

5. The method according to claim 1 wherein the step of applying a strike pulse to a second input pin that is adjacent to at least one first input pin comprises applying a pulse current having a desired duration.

6. The method of testing a CMOS based integrated circuit device according to claim 1 further comprising the step of disconnecting all output pins associated with the device such that all device outputs are left unconnected.

7. A micro-latch-up test circuit comprising:

a CMOS-based integrated circuit device having a supply pin, a ground pin, a plurality of input pins, and at least one output pin;

a power supply operational to deliver a maximum supply voltage to the supply pin and at least one input pin selected from the plurality of input pins;

a first current measurement instrument operational to measure supply current from the at least one input pin selected from the plurality of input pins;

a second current measurement instrument operational to measure supply current from the supply pin; and a trigger pulse current source operational to deliver a strike pulse to a device input pin adjacent the at least one input pin receiving the maximum supply voltage, wherein each output pin is left unconnected.

* * * * *